United States Patent [19]

Holmstrom et al.

[11] Patent Number: 5,082,799
[45] Date of Patent: Jan. 21, 1992

[54] METHOD FOR FABRICATING INDIUM PHOSPHIDE/INDIUM GALLIUM ARSENIDE PHOSPHIDE BURIED HETEROSTRUCTURE SEMICONDUCTOR LASERS

[75] Inventors: Roger P. Holmstrom, Wayland; Edmund Meland, Chelmsford; William Powazinik, Marlborough, all of Mass.

[73] Assignee: GTE Laboratories Incorporated, Waltham, Mass.

[21] Appl. No.: 583,409

[22] Filed: Sep. 14, 1990

[51] Int. Cl.$^5$ .............................. H01L 21/20
[52] U.S. Cl. .................... 437/129; 156/651; 437/228
[58] Field of Search ............ 148/DIG. 25, 26, 50, 148/51, 56, 65, 72, 95, 110, 169; 156/610-613, 643, 644, 647, 649, 651; 357/16, 17; 372/43, 46, 48; 437/81, 129, 133, 167, 225, 228, 987

[56] References Cited

U.S. PATENT DOCUMENTS

| | | | |
|---|---|---|---|
| 4,264,381 | 4/1981 | Thompson et al. | 437/129 |
| 4,496,403 | 1/1985 | Turley | 437/129 |
| 4,644,551 | 2/1987 | Kawano et al. | 372/46 |
| 4,662,988 | 5/1987 | Renner | 156/648 |
| 4,764,246 | 8/1988 | Bridges et al. | 156/643 |
| 4,815,083 | 3/1989 | Sugou et al. | 372/46 |
| 4,818,722 | 4/1989 | Heiney | 437/129 |
| 4,830,986 | 5/1989 | Plumb | 437/129 |
| 4,990,465 | 2/1991 | Liau et al. | 437/129 |

FOREIGN PATENT DOCUMENTS

| | | | |
|---|---|---|---|
| 0319954 | 6/1989 | European Pat. Off. | 437/129 |
| 0111284 | 9/1981 | Japan | 437/129 |
| 0043428 | 3/1982 | Japan | 437/129 |
| 0092591 | 5/1984 | Japan | 437/129 |
| 0130492 | 7/1984 | Japan | 437/129 |
| 0227177 | 12/1984 | Japan | 437/129 |
| 0251689 | 12/1985 | Japan | 372/46 |
| 0067980 | 4/1986 | Japan | 372/46 |
| 0114092 | 5/1989 | Japan | 372/46 |

OTHER PUBLICATIONS

Bowers et al., "High-Speed InGaAsP Constricted-Mesa Lasers", IEEE J. Quantum Electron., vol. QE-22, pp. 833-844.
Liau et al., "A Novel Technique for GaLnAsP/InP Buried Heterostructure Laser Fabrication", Appl. Phys. Lett. vol. 40, pp. 568-570 (Apr. 1982).
Su and Olshansky, "Ultra-High Frequency Modulation of InGaAsP Lasers", Tech., Dig. Conf. Optical Fiber Comm. Atlanta, GA, pp. 90-91 (Feb. 1986).
Su and Lanzisera, "Effect of Doping Level on the Gain Constant and the mod. Bw. of InGaAsP Semiconductor Lasers", Appl. Phys. Lett., 45, pp. 1302-1304, (1984).
Ohtoshi et al., "Current Leakage Mechanism in InGaAsP/InP Buried-Heterostructure Lasers", 11th IEEE Intl. Semi. Lasers Conf. Boston, MA, pp. 210-211 (1988).
Flynn et al., "Double Injection Leakage Currents ... InP:Fe Current Blocking Layers", 11th IEEE Intl. Semi Lasers Conf., Boston MA; pp. 216-217 (1988).

*Primary Examiner*—Olik Chaudhuri
*Assistant Examiner*—William Bunch
*Attorney, Agent, or Firm*—Victor F. Lohmann, III

[57] ABSTRACT

A semiconductor laser having a high modulation bandwidth is made by utilizing an InGaAsP cap layer and an InGaAsP active layer of different crystal structure. Channels are anisotropically etched through the cap, cladding and active layers and partially through the buffer layer. The active and cap layers a laterally etched and a semi-insulating material is overlaid the sidewalls. A further etching leaves a thin wall of the semi-insulating material surrounding the active layer. 1.3 μm InGaAsP lasers with 3 dB bandwidths of 24 GHz and intrinsic resonance frequencies in excess of 22 GHz have been successfully fabricated. This is the highest bandwidth ever reported for a semiconductor laser, and the highest resonance frequency for InGaAsP lasers. Excellent modulation efficiencies are observed to high frequencies.

3 Claims, 8 Drawing Sheets

METHOD FOR FABRICATING INDIUM PHOSPHIDE/INDIUM GALLIUM ARSENIDE PHOSPHIDE BURIED HETEROSTRUCTURE SEMICONDUCTOR LASERS

CROSS-REFERENCE TO RELATED APPLICATION

This application is related to an application entitled "Processing Method for Fabricating Electrical Contacts to Mesa Structures in Semiconductor Devices," Ser. No. 07/583,410; filed simultaneously herewith on Sept. 14, 1990 by R. F. Holmstrom, E. Meland and F. D. Crawford, inventors, and assigned to the same assignee as this application.

FIELD OF THE INVENTION

This invention pertains to semiconductor lasers and more particularly to high modulation bandwidth single transverse mode semiconductor lasers.

BACKGROUND OF THE INVENTION

As fiber optic communication systems continue to push to even higher data rates and larger bandwidths, the availability of reproducible and reliable high-speed lasers becomes increasingly important. This is particularly true for microwave modulation schemes like subcarrier multiplexing, where low relative intensity noise (RIN) is very important, or for phase modulated systems, where the avoidance of phase noise is crucial. In both of these modulation schemes it is very important to avoid operating near the resonance peak of the laser, where RIN peaks and a $\pi$ phase shift occurs. Both of these phenomena have a deleterious effect on the noise performance of the system. The further below the resonance peak the fiber optic system can be designed to operate, the better its noise performance will be. Clearly, demands on the system designer are reduced by the availability of lasers with higher resonance frequencies and modulation bandwidths.

Fabrication of single transverse mode semiconductor lasers with modulation bandwidth in excess of 15 GHz depends heavily upon both the accurate control of the active layer doping, width, and thickness, and upon providing a lateral optical cladding of the active layer which minimizes surface recombination and carrier leakage while not affecting the single transverse modal properties of the laser. In addition, a low capacitance and low series resistance structure is required to minimize electrical parasitics.

High frequency single transverse mode semiconductor lasers have been achieved by constricted mesa (Bowers, et al, "High-speed InGaAsP constricted mesa lasers", IEEE J. Quantum Electron., Vol. QE-22, pp. 833–884, June 1986), mass transport (Liau, et al, "A novel technique for GaInAsP/InP buried heterostructure fabrication", Appl. Phys. Lett., Vol. 40, pp. 568–570, April 1982) and vapor phase regrowth (Su, et al, "Ultra-high frequency modulation of InGaAsP lasers", Tech. Dig. Conf. Optical Fiber Communication, pp. 90–91, February 1986) techniques. These structures have broad mesa tops so as to reduce series resistance and facilitate the formation of ohmic contacts. In order to achieve this structure, the processes reported to date require selective wet chemical etching of the active layer of 4 microns or more to reduce its width and/or the epitaxial growth of thick layers of high quality p-doped, semi-insulating, or pn blocking layer configurations. These regrown materials are subject to unintentional doping to and from the p-type device structure layers during the regrowth process and tend to be electrically leaky which severely limits the achievable output power and bandwidth. (Ohtoshi, et al, "Current leakage mechanism in InGaAsP/InP buried heterostructure lasers", 11th IEEE International Semiconductor Laser Conference, Boston, Mass., 1988). In addition, wet chemical etching through dielectric masks, used to form the initial mesa structure, is inherently non-uniform so that control of active layer width, a necessity for high bandwidth single transverse mode operation, is very difficult resulting in low yield and non-reproducible results. Alternatively, the fabrication of narrow mesa tops leads to the additional problems of high series resistance and difficulty in photolithographically defining and forming ohmic contacts.

OBJECTS OF THE INVENTION

Accordingly, it is a primary object of this invention to obviate the above noted and other disadvantages of the prior art.

It is a further object of this invention to provide a high modulation bandwidth single transverse mode semiconductor laser.

It is yet a further object of this invention to provide a controllable and reproducible fabrication process for such a laser.

SUMMARY OF THE INVENTION

In a first aspect of the invention, an indium phosphide-based semiconductor laser is produced such that the epitaxial layer configurations (composition, thickness and doping) are appropriate for high frequency laser applications. This is accomplished by sandwiching a thin, narrow active layer of small bandgap material between thicker, larger bandgap material and filling the interstices on each side of the active layer with a semi-insulating layer in such manner that the sidewalls of the device form a smooth surface, thereby reducing the homojunction capacitance and carrier leakage.

In a second aspect of the invention, the method of fabrication of a 1.3$\mu$ InGaAsP laser with three dB bandwidth of 24 GHz and intrinsic resonance frequencies uses a dry-etched vapor phase regrowth structure to fabricate lasers from LPE-grown, 1.3$\mu$ double heterostructure material, or any suitable epitaxial growth technique, i.e., (VDE, MOCVD, and MBE) that will produce InGaAsP/InP double heterostructure material. The method comprises the steps of dry-etching channels, followed by selective etching to undercut the active layer, then InP regrowth on the sidewalls in a halide vapor phase system. $SiO_2$, and the p- and n-contact metallizations are alloyed ZnAu and SnAu, respectively, using a flood exposure technique.

DETAILED DESCRIPTION OF THE PREFERRED EMBODIMENT

An injection type semiconductor laser device embodying the present invention will now be described in detail by reference to a laser device of a InGaAsP-InP double heterostructure as an example.

Figure 1:
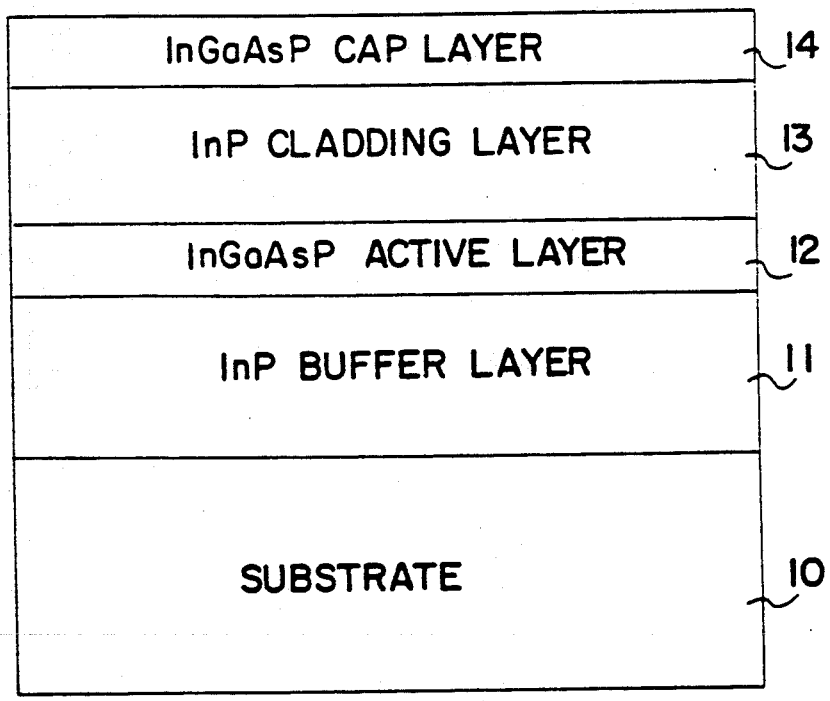
FIG. 1 is a cross-sectional view of a semiconductor wafer from which an embodiment of the laser of the present invention can be formed.

A typical wafer as an initial starting point in the fabrication process is illustrated in FIG. 1. The substrate is typically composed of crystalline InP and is covered by a buffer layer of n-InP of about 1-2 microns thick. The active layer is composed of $In_{.73}Ga_{.27}As_{.63}P_{.37}$ and has a thickness ideally of 0.2 microns. On top of the active layer is a cladding layer of InP approximately 1 micron thick. The fourth layer comprises a cap layer of $In_{.8}0Ga_{.20}As_{.40}P_{.60}$ of from 0.2–0.3 microns in thickness. A wafer of such composition and structure can be made by techniques well known in the art by chemical vapor deposition (CVD), liquid phase epitaxy (LPE) or a combination thereof and, and include all compositions of $In_{1-x}Ga_xAs_yP_{1-y}$ that would produce high frequency lasers emitting at $\lambda = 1.25$ μm to $\lambda = 1.58$ μm and all wavelengths between.

Figure 2A:
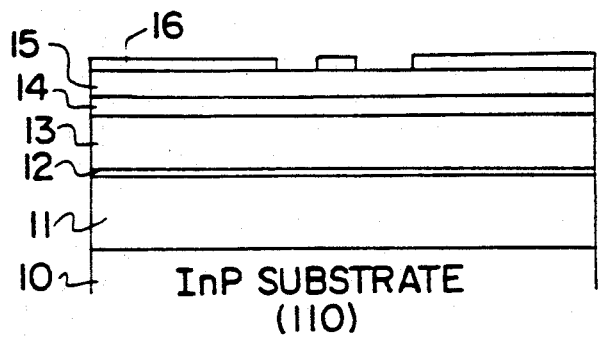
FIGS. 2a through 2f are cross-sectional views of a portion of the wafer during various stages of fabrication of the embodiment of FIG. 1.
Figure 2B:
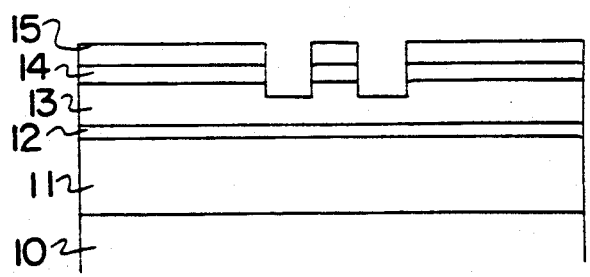
Figure 2C:
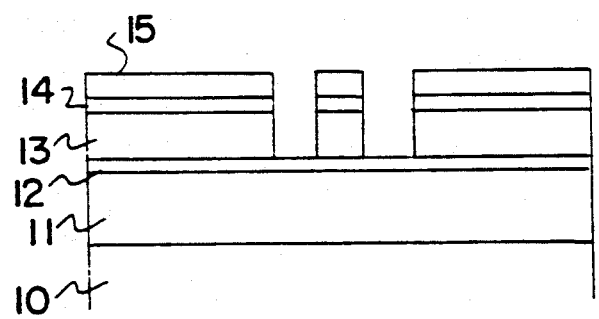
Figure 2D:
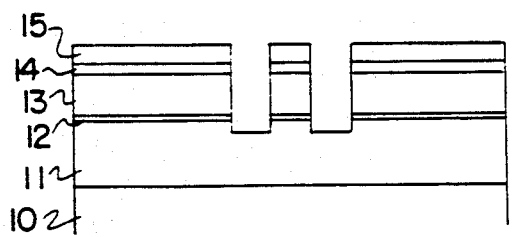
Figure 2E:
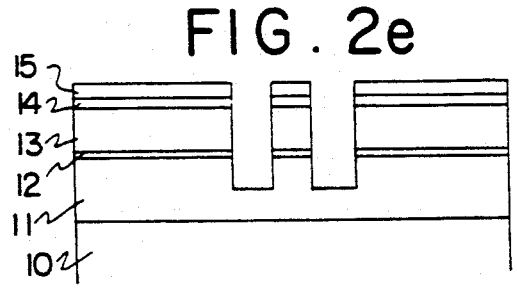

The initial step to produce the laser of the present invention is to define the mesa. The mesa width is determined by the desired final active layer width, the desired amount of regrowth on both sides of the active layer and any processing variables encountered in the photolithographic, dry etching and wet etching steps. As an example, if a one-micron ±0.1 micron active layer width with 0.1–0.2 microns of regrowth per side was desired, the initial mask for the mesa would be in the order of 2.0 microns. The first step is to deposit a mask material, for example, 0.3 microns of $SiO_2$, on the epitaxial cap layer that is compatible with said layer and with the dry and wet processing chemistries used in defining the mesa. The next step is to apply a layer of photoresist material using standard photolithographic techniques. The next step is to align and delineate stripes in the photoresist along the (110) crystallographic direction of the InP material, as shown in FIG. 2a. The exposed mask material is then plasma etched in accordance with well known plasma etching techniques, for example utilizing $CF_4$, to expose the underlying InGaAsP cap material. After the photoresist is removed, the wafer is subjected to plasma etching in accordance with well known plasma etching techniques, for example $C_2H_6/H_2$, to etch through the InGaAsP cap layer and stopping in the InP cladding layer in regions not protected by the $SiO_2$ mask, resulting in a wafer as shown in FIG. 2b. The wafer is then subjected to a wet chemical etch of a 1:9 ratio of HCl and $H_3PO_4$ acid mixture to selectively and anisotropically remove the InP cladding layer, using the InGaAsP cap layer as a mask, resulting in a wafer having the appearance as shown in FIG. 2c. The wafer is again subjected to a plasma etch with the $SiO_2$, the cap and the cladding layer now acting as a mask to etch through the InGaAsP active layer, stopping in the InP buffer layer, resulting in a wafer as shown in FIG. 2d. The wafer is again subjected to a wet chemical etch using the aforementioned HCl and $H_3PO_4$ acid mixture for a time sufficient to remove a portion, approximately one-half, of the exposed InP buffer layer, using the InGaAsP active layer as a mask, as shown in FIG. 2e.

Figure 2F:
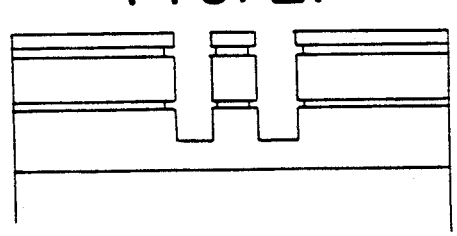

The wafer is again exposed to wet chemical etching, this time in a solution of $K_3Fe(CN)_6$:KOH:$H_2O$, which is well known, to selectively etch the InGaAsP cap and active layers laterally as shown in FIG. 2f. In view of the difference in composition of the active layer and the cap layer, the solution etches the active layer at about twice the rate of the cap layer. Since the amount of lateral etching required is only on the order of 0.4 microns or less, the resulting active layer is very uniform across the entire wafer. With the mesa, the active layer width and the cap width now defined, the $SiO_2$ mask is removed by hydrofluoric acid.

Figure 3A:
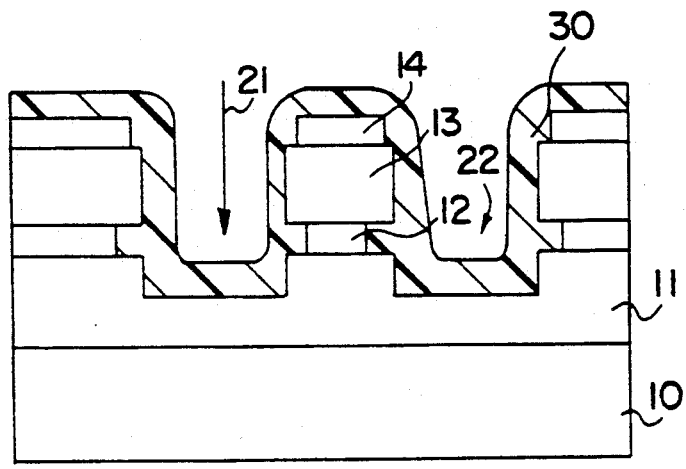
FIGS. 3a and 3b are cross-sectional views of a portion of the wafer during various stages of fabrication of the embodiment of FIG. 1.
Figure 3B:
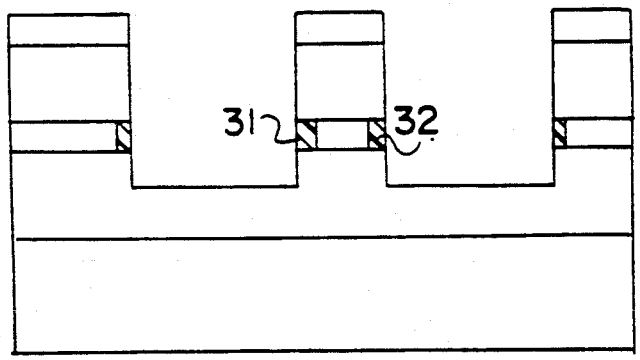

The wafer is then exposed to vapor phase epitaxial growth of an overlayer of semi-insulating InP as shown in FIG. 3A. The amount of regrowth is limited to minimize intentional diffusion of dopants into and out of the various devices layers thus degrading the quality of the devices. The exact amount and uniformity of regrowth is critical only to the extent that the under cut regions be completely filled laterally. The wafer is again etched in the 1:9 hydrochloric and phosphoric acid mixture, leaving an unetched amount of regrowth cladding on the side wall of the active layer, the lateral dimension of this cladding being determined solely by the relative undercutting of the active layer with respect to the cap layer, and in view of the relative etch rate of the lateral etching and the amount of etching of the active layer (i.e. about 0.3–0.4 microns) the width of the cladding will be about 0.1–0.2 micron uniformly along the active layer. This technique automatically controls the width of the regrown InP and symmetrically aligns the regrown material around the active layer. This is in contrast to the other techniques where either the active layer width is poorly controlled due to oversized mesa and/or the amount of regrowth is relatively large (e.g. greater than 1 micron) or highly non-uniform for regrowth of less than 0.5 microns. The advantage of achieving a thin regrown region is that it reduces homojunction capacitance and carrier leakage.

A dielectric material, for example approximately 0.4 microns $SiO_2$, is deposited on the mesa side of the wafer, conforming to and encapsulating the mesa, the channels and covering the cap layer. This dielectric serves a number of purposes; it defines the p-contact using localized flood exposure, as disclosed in the cross-referenced application; it acts as a diffusion barrier during the diffusion step; it electrically isolates the p-metal overlay from the cap layer and is intrinsic to the reduction of the electrical parasitics of the device.

Figure 4A:
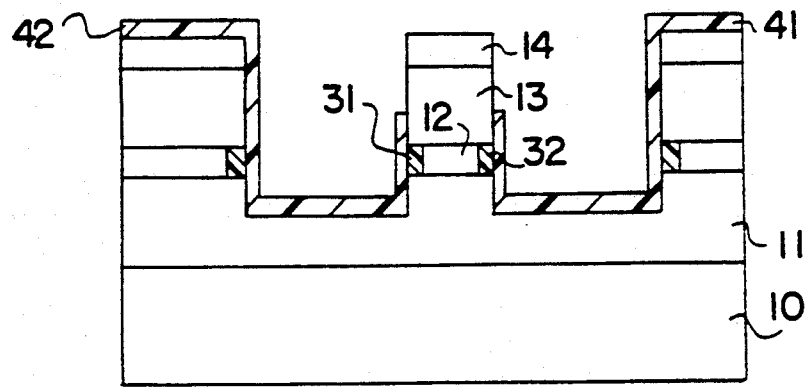
FIGS. 4a through 4d are cross-sectional views of a portion of the wafer during various stages of fabrication of the embodiment of FIG. 1.
Figure 4B:
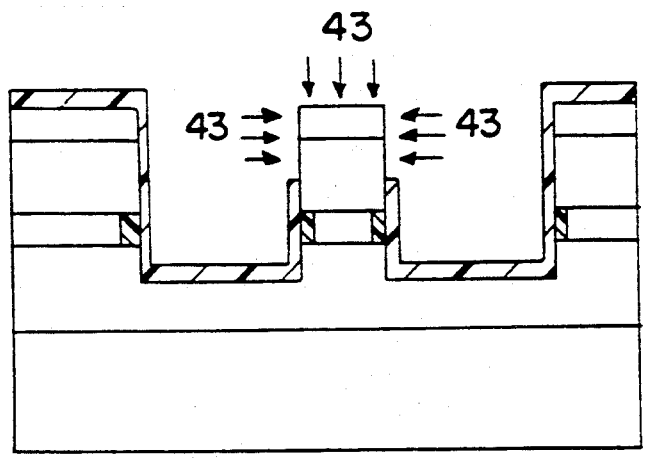
Figure 4C:
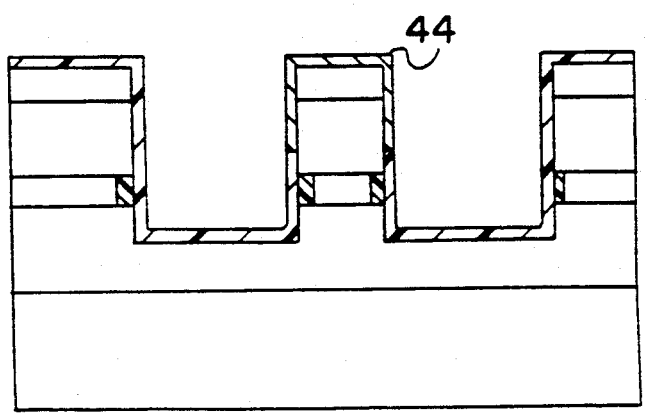
Figure 4D:
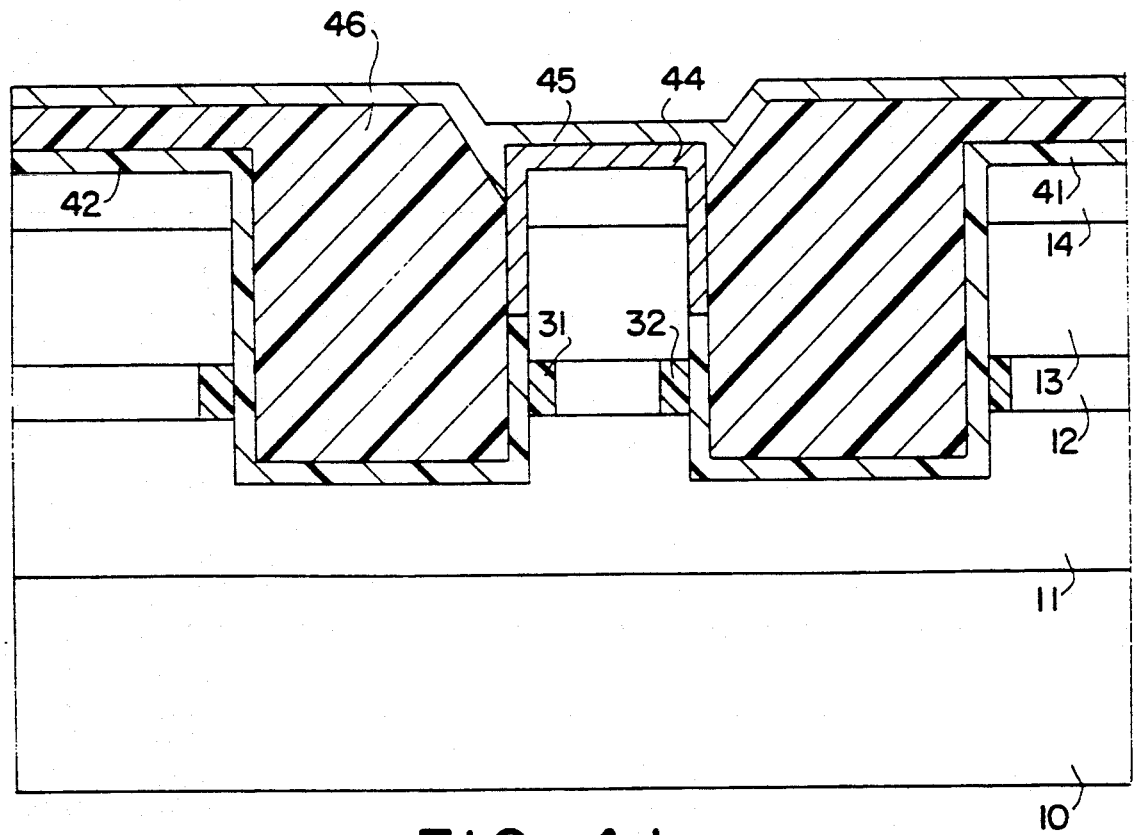

The contact openings are formed by using the localized flood exposure described in the copending application filed of even date herewith and assigned to the same assignee as the present application and is incorporated herein by reference thereto. In accordance with this method, the entire mesa top and an appreciable amount of the mesa sidewall is bared as is shown in FIG. 4a. Diffusion of an acceptor dopant, such as zinc, to p-type epitaxial layers can be performed as shown in FIG. 4b so that the entire exposed surface is electrically modified to yield a higher differential gain, lower resistivity and lower contact resistance. By controlling the amount of exposed sidewall, a feature of this technique, and the diffusion time and temperature, the active layer can be heavily doped beyond the levels possible in as-grown epitaxial layers, a necessity for achieving high frequency operation. Ohmic contact metal may then be deposited over the entire exposed surface such that the largest area of contact possible in this structure is achieved as shown in FIG. 4c and thus the lowest possible contact resistance in this structure is achieved without increasing the parasitic junction capacitance. In addition, this ohmic metal contact process results in thermal properties that are superior to the other structures. A variety of other process techniques such a thick dielectrics to reduce parasitic chip capacitance and permits "epi down" mounting are performed. A resulting structure is shown in FIG. 4d.

Figure 5:
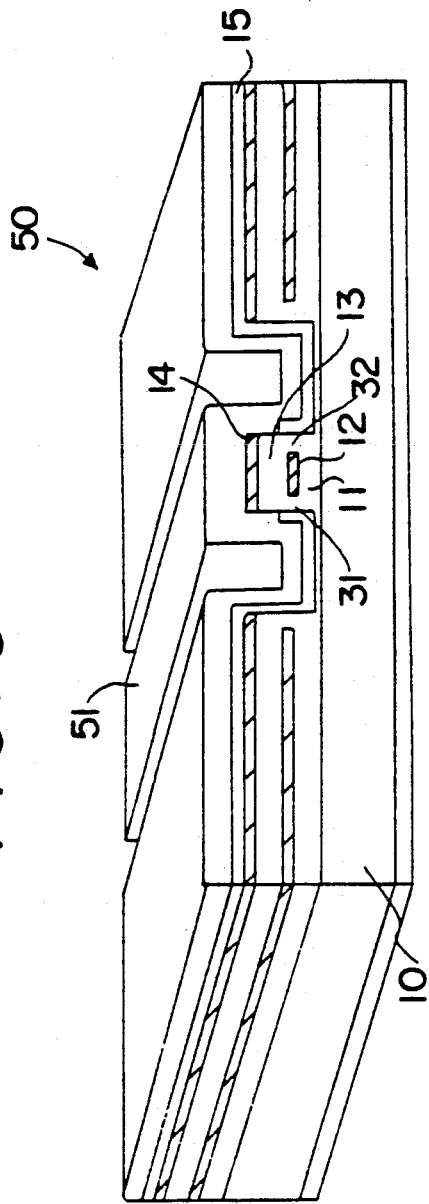
FIG. 5 is a perspective view in cross-section showing the structure of the injection type semiconductor laser embodiment of the present invention.

The substrate, or bottom, side of the wafer is thinned to facilitate cleaving. An electrode is formed on the bottom of the wafer, opposite to the ohmic contact on the top of the mesa structure, the wafer is divided into chips and made into laser devices as illustrated in FIG. 5 in a manner well known in the art.

The intrinsic resonance of a semiconductor laser is proportional to the product of the total loss, the differential gain $\partial g/\partial N$, and the photon density. If these parameters are optimized, it is then necessary to minimize electrical parasitics (i.e., the RC time constant) to fully exploit the modulation capabilities of the laser. Past work on ultra-high-frequency diode lasers has been plagued by the difficulty of fabricating lasers with very small active areas, low leakage, and low electrical parasitics. This invention utilizes a dry-etched, vapor-phase regrowth structure to fabricate lasers from LPE-grown, 1.3 $\mu$m double heterostructure material. This technique is a modification of the wet-etched, vapor-phase-regrowth technique previously used. Basically, it consists of dry etching channels, followed by selective etching to undercut the active layer, then InP regrowth on the sidewalls in a halide vapor phase system. $SiO_2$ is used as a mask and for electrical isolation, and the p- and n-contact metallizations are alloyed ZnAu and SnAu, respectively. The dry-etched perpendicular sidewalls result in two improvements compared to previously wet-etched vapor-phase-regrown lasers: 1) well-controlled regrowth widths of about 0.2 $\mu$m per side. Since this regrowth forms the p-n blocking homojunctions, limiting this width reduces homojunction leakage (thus improving the linearity of the power-current curves) and minimizes diffusion capacitance (thus extending the RC limit); 2) the entire top of the mesa was contained, using a flood exposure technique, thus reducing the contact and series resistance of the device.

A third improvement was aimed at increasing the photon density in the laser cavity. Because of the perpendicular mesa sidewalls and the minimized regrowth, it was possible to accurately control the width of the emitting region to 0.9±0.1 $\mu$m. This dimension, coupled with active layer thicknesses of about 0.2 $\mu$m and cavity lengths of 100 to 130 $\mu$m, resulted in extremely high photon densities in a single spatial mode, even at moderate drive currents.

Figure 6:
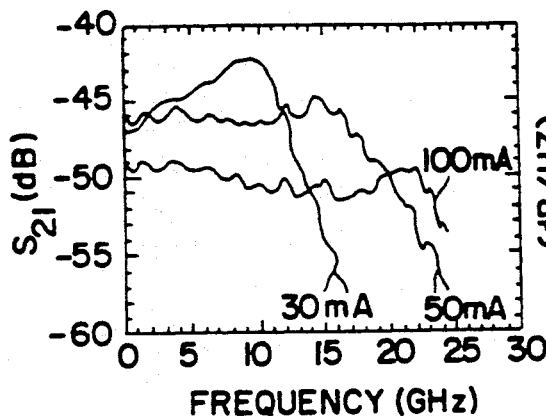
FIGS. 6, 7, 8, and 9 are diagrams illustrating operating characteristics of an embodiment of a laser in accordance with the present invention.

Lasers made in accordance with this invention have achieved a modulation bandwidth of 24 GHz at room temperature and intrinsic resonance frequencies in excess of 22 GHz. The lasers are also characterized by a linear power-current curve, resulting in excellent modulation efficiencies even at 24 GHz. The swept frequency response ($S_{21}$) is shown in FIG. 6 of a laser with a 3-dB bandwidth of 24 GHz. The 3-dB bandwidths for lasers according to this invention ranged from 18 to 24 GHz for lasers with cavity lengths of about 130 microns. FIG. 6 shows that the modulation efficiency at 24 GHz has dropped only 3 dB with a 100 mA bias current compared to its low-frequency, low-bias values.

Figure 7:
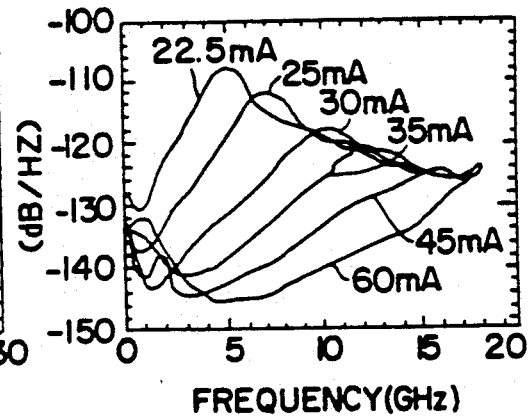
Figure 8:
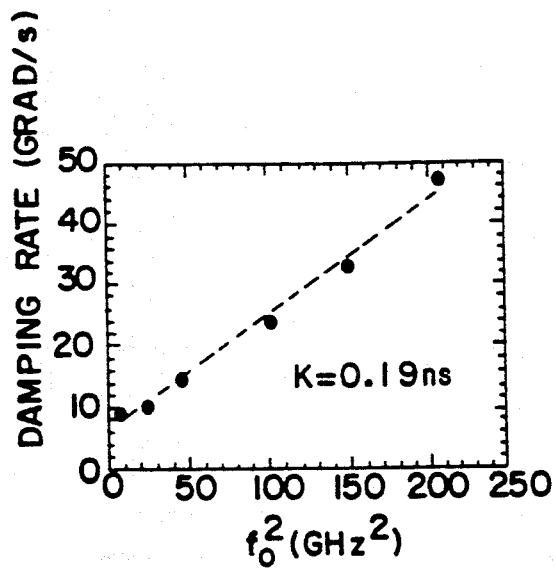

The intrinsic resonance frequency, $f_o$, of the lasers was found from the measured relative intensity noise (RIN) spectral density. The RIN spectrum, shown in FIG. 7, indicates that even at bias currents as low as 60 mA the response peak is beyond 18 GHz. These data, together with the $S_{21}$ data of FIG. 6, indicate that the intrinsic resonance of this laser is in excess of 22 GHz. By fitting the RIN data to the standard single-mode rate equation solution, the resonance frequency, $f_o$, and damping rate, $\gamma$, are accurately determined, free of any electrical parasitics. The maximum achievable bandwidth in the absence of parasitics (i.e. limited only by damping) can then be estimated, as shown by Olshansky, et al, IEEE J. Quan. Electron. QE 23, p. 1410 (1987), using the relationship $f_{3dB}=8.8/K$, where $K=\gamma/f_o^2$. FIG. 8 shows the fitted $\gamma$ versus $f_o^2$ for the same laser. From the slope, K is found to be 0.19 ns, while more typical values are approximately 0.3 ns. These values of K suggest that the maximum damping-limited bandwidth could be as high as 44 GHz.

Figure 9:
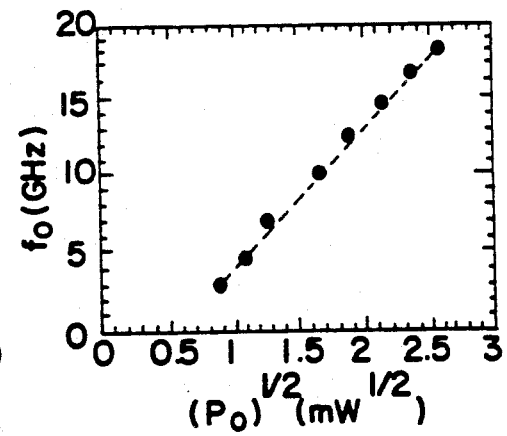

The intrinsic resonance frequency is plotted as a function of the square root of the optical power in FIG. 9. The slope of this line is 8.9 GHz/mW$^{\frac{1}{2}}$. We believe this to be the highest value ever reported for a semiconductor laser, more typical values of this slope are 5 to 6 GHz/mW$^{\frac{1}{2}}$ for semiconductor lasers. Because of the extremely high value of this slope, large bandwidths are obtained at relatively low operating currents. Specifically, a 3 dB bandwidth of 20 GHz is achieved with as little as 55 mA of drive current. This may result in improved long-term reliability compared to previous high-frequency lasers.

A record modulation bandwidth of 24 GHz at room-temperature is reported for 1.3 $\mu$m lasers fabricated using a dry-etched, vapor phase regrowth technique. This and other dynamic characteristics are significantly better than the previous record of 22 GHz set by 1.3 $\mu$m VPR-BH lasers, and the 15 to 18 GHz bandwidths which are more typical for high-frequency InGaAsP laser structures. Furthermore, we observe intrinsic resonance frequencies in excess of 22 GHz, the highest yet obtained for either conventional double heterostructure or quantum well InGaAsP lasers. These improvements are accomplished by using a dry-etched, vapor phase regrowth technique. These lasers exhibit reduced leakage currents and electrical parasitics, and are characterized by a linear power-current curve, resulting in excellent modulation efficiencies even at 24 GHz.

We have demonstrated 1.3 $\mu$m lasers with intrinsic resonance frequencies in excess of 22 GHz, and 3dB bandwidths of up to 24 GHz. This is a significant improvement over the previous record of 22 GHz for the 3 dB bandwidth. These advances were achieved primarily by increasing the photon density in the lasing cavity (to increase the intrinsic resonance frequency), and by minimizing electrical parasitics. It is expected that these devices will play an important role in the realization of extremely broadband fiber optic systems in general, and in microwave multiplexed systems such as subcarrier systems in particular.

What is claimed is:

1. A method of fabricating a semiconductor laser having an epitaxial layer wafer configuration comprising a substrate layer, a buffer layer, an active layer, a cladding layer, and a cap layer, wherein said wafer configuration is fabricated for high frequency laser applications, comprising the steps of:

a. depositing on said cap layer of said wafer a layer of mask material compatible with said cap layer;
b. applying a layer of photoresist material on said mask layer;
c. delineating stripes in said photoresist layer along a particular crystallographic direction of one of said wafer layers, thereby exposing window stripes of said mask layer;
d. plasma etching said exposed windows of said mask layer to expose said underlying cap layer to form exposed window stripes of said cap layer;
f. removing said photoresist;
g. subjecting regions of said wafer not protected by said mask material to plasma etching to completely etch said exposed cap layer windows and to partially etch through said cladding layer;
h. subjecting said wafer to a wet chemical etch mixture to selectively and anistropically remove the exposed material of said cladding layer, using said cap layer as an effective mask, whereby window stripes of said active layer are exposed;
i. subjecting said wafer to a plasma etch mixture wherein said mask material, cap layer, and cladding layer serve as an effective mask to etch through said active layer and partially etch through said buffer layer;
j. subjecting said wafer to a wet chemical etch for a time sufficient to remove a selected portion of the exposed buffer layer, using said active layer as an effective mask;
k. exposing said wafer to a wet chemical etching mixture to selectively and concurrently etch exposed regions of said cap layer and said active layer in a lateral direction to create spaces in sidewalls of said cap and active layer, wherein said etching mixture etches said active layer at a known faster rate than said cap layer;
l. removing said mask layer;
m. exposing said entire wafer to an epitaxial growth of an overlayer of a semi-insulating material;
n. etching said wafer to leave an unetched amount of regrowth cladding only in the lateral side wall spaces of said active layer wherein a lateral dimension of said regrowth cladding is determined by the relative undercutting of said active layer with respect to said cap layer;
o. depositing on the mesa side of said wafer a dielectric material which conforms to and encapsulates said mesa and a channel covering said cap layer;
p. forming contact openings on said wafer by performing localized flood exposure of said wafer to controllably remove said dielectric material from the top of said mesa and from a substantial portion of the mesa sidewall;
q. diffusing an appropriate dopant into said contact openings;
u. depositing ohmic contact metal over the entirety of said contact openings;
r. thinning said substrate layer; and
s. forming an electrode on said thinned substrate layer.

2. A method of making a semiconductor device as set forth in claim 1, wherein said second layer is composed of $In_xGa_{1-x}As_yP_{1-y}$ in which $x=0.73$ and $y=0.67$ and said fourth layer is composed of $In_sGa_{1-s}As_tP_{1-t}$ in which $s=0.8$ and $t=0.4$.

3. A method of making a semiconductor laser device as set forth in claim 1 or 2, in which the lateral etching of said second and fourth layers is accomplished by a solution of $K_3Fe(CN)_6:KOH:H_2O$.

* * * * *